United States Patent
Wallace et al.

(10) Patent No.: US 6,420,729 B2
(45) Date of Patent: Jul. 16, 2002

(54) PROCESS TO PRODUCE ULTRATHIN CRYSTALLINE SILICON NITRIDE ON SI (111) FOR ADVANCED GATE DIELECTRICS

(75) Inventors: Robert M. Wallace, Richardson; Glen D. Wilk, Dallas, both of TX (US); Yi Wei, Chandler, AZ (US); Sunil V. Hattangady, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 21 days.

(21) Appl. No.: 09/747,966

(22) Filed: Dec. 27, 2000

Related U.S. Application Data

(62) Division of application No. 09/270,173, filed on Mar. 16, 1999, now Pat. No. 6,277,681.

(51) Int. Cl.[7] .............................................. H01L 29/04
(52) U.S. Cl. ...................................... 257/64; 438/198
(58) Field of Search ............................ 427/96; 257/646, 257/64; 437/160; 438/478, 198, 239, 250, 251

(56) References Cited

U.S. PATENT DOCUMENTS

| | | | |
|---|---|---|---|
| 4,996,081 A | * 2/1991 | Ellul et al. ..................... | 427/96 |
| 5,422,306 A | 6/1995 | Niwa et al. .................. | 437/132 |
| 5,428,244 A | * 6/1995 | Segawa et al. ............. | 257/646 |
| 5,464,792 A | * 11/1995 | Tseng et al. ................ | 437/160 |
| 5,872,376 A | 2/1999 | Gardner et al. ............ | 257/336 |
| 5,966,624 A | * 10/1999 | Shen .......................... | 438/478 |

* cited by examiner

*Primary Examiner*—David Nelms
*Assistant Examiner*—Bau T Le
(74) *Attorney, Agent, or Firm*—Wade James Brady, III; Frederick J. Telecky, Jr.

(57) ABSTRACT

A method of making a semiconductor device and the device. The device, according to a first embodiment, is fabricated by providing a silicon (111) surface, forming on the surface a dielectric layer of crystalline silicon nitride and forming an electrode layer on the dielectric layer of silicon nitride. The silicon (111) surface is cleaned and made atomically flat. The dielectric layer if formed of crystalline silicon nitride by placing the surface in an ammonia ambient at a pressure of from about $1 \times 10^{-7}$ to about $1 \times 10^{-5}$ Torr at a temperature of from about 850° C. to about 1000° C. The electrode layer is heavily doped silicon. According to a second embodiment, there is provided a silicon (111) surface on which is formed a first dielectric layer of crystalline silicon nitride having a thickness of about 2 monolayers. A second dielectric layer compatible with silicon nitride and having a higher dielectric constant than silicon nitride is formed on the first dielectric layer and an electrode layer is formed over the second dielectric layer. A third dielectric layer of silicon nitride having a thickness of about 2 monolayers can be formed between the second dielectric layer and the electrode layer. The second dielectric layer is preferably taken from the class consisting of tantalum pentoxide, titanium dioxide and a perovskite material. Both silicon nitride layers can be formed as in the first embodiment. The electrode layer is preferably heavily doped silicon

8 Claims, 1 Drawing Sheet

PROCESS TO PRODUCE ULTRATHIN CRYSTALLINE SILICON NITRIDE ON SI (111) FOR ADVANCED GATE DIELECTRICS

CROSS REFERENCE TO PRIOR APPLICATIONS

This application is a division of Ser. No. 09/270,173, filed Mar. 16, 1999 now U.S. Pat. No. 6,277,681.

BACKGROUND OF THE INVENTION

1. FIELD OF THE INVENTION

This invention relates to a method of producing ultrathin crystalline silicon nitride on Si (111) and formation of semiconductor devices using such ultrathin crystalline silicon nitride.

2. BRIEF DESCRIPTION OF THE PRIOR ART

The continued down-scaling of the geometries in VLSI technology has involved, as a result of such down-scaling, a reduction in component film thicknesses, examples being gate dielectrics for FET semiconductor devices and the capacitor dielectric for semiconductor memory devices. Thickness uniformity requirements for such films (about 0.14 nanometers in thickness in present technology) requires extraordinary control over the silicon wafer surface morphology (i.e., subsequent interfacial roughness) to achieve necessary scaling. The acute sensitivity of interface roughness with ultrathin films is evident when one considers the control required over large (200 mm or 300 mm) wafers.

Conventional silicon semiconductor technology incorporates Si (100) substrates, largely because of interface trap density (Dit) considerations associated with oxide films on Si (100) which has been extensively researched over the past two decades. Moreover, it has been demonstrated that surface preparation methods currently developed, such as HF-last treatments, can result in a Si (100) hydrogen-terminated surface with a roughness which is unacceptable for prospective dielectric film thickness uniformity requirements.

The use of alternative dielectric materials, such as silicon nitride, has been considered as a means to increase the gate dielectric constant and also to serve as a diffusion barrier to dopants in the gate material. However, the current silicon nitride fabrication techniques on Si (100) result in an amorphous nitride or oxynitride layer which may exhibit deleterious interface states (traps) which degrade ultimate device performance.

A further problem with silicon dioxide dielectrics over Si (100) substrates is that boron from boron-doped polysilicon gate structures can diffuse through the silicon dioxide, this problem increasing with decreased gate oxide thickness geometries, thereby degrading the properties of the device, particularly in the channel region. Boron, on the other hand, does not diffuse through silicon nitride, however, the interface between silicon nitride and Si (100) results in an amorphous silicon nitride and provides an inferior structure to that with silicon dioxide by causing a disruption of the electron flow in the channel of the active semiconductor devices.

A separate problem with silicon dioxide dielectrics is that the extremely small thicknesses allow unacceptable leakage currents as a result of electrons tunneling from the gate to the drain regions of transistors. Since silicon nitride has a larger bulk dielectric constant than silicon dioxide (~7 compared to about 3.9), a thicker silicon nitride layer can be used which has the same capacitance density as a thinner silicon dioxide layer. Since electron tunneling currents depend exponentially on layer thickness, even an increase in dielectric thickness of about 10 to about 20 Angstroms could reduce leakage current by several orders of magnitude.

SUMMARY OF THE INVENTION

Recent work has demonstrated that the Dit from oxides on Si (111) can be made comparable to those on Si (100), thus making devices on such substrates feasible. The silicon (111) surface can be controlled to be made hydrogen-terminated and atomically flat from a careful control of the surface preparation solution pH. The resultant smooth surface can therefore result in a low roughness (<0.1 nm, rms) interface after subsequent film deposition. Recent research has also demonstrated the potential formation of an ordered silicon nitride film on the Si (111) surface from the reaction of $NH_3$ with an atomically clean Si (111) surface, i.e., where no surface impurities are detected, at temperatures between 800° C. and 1130° C. under high vacuum conditions of from about $10^{-7}$ to about $10^{-5}$ Torr $NH_3$ partial pressures. The cleaning process could include, for example, a standard semiconductor wet clean followed by oxidation (chemical or thermal), then followed by HF-last stripping of the oxide for H-termination. The hydrogen is then desorbed in the course of the temperature ramp-up for nitride deposition. Alternatively, the cleaning can take place by ultra high vacuum (UHV), from about $10^{-11}$ to about $10^{-9}$ Torr, "flash heating" to about 1100° C. and cooling to room temperature to form a well-ordered surface. Under the proper temperature conditions (850° C. to 1000° C.), the nitride film covered Si (111) surface is atomically flat, i.e., where only single height steps between nitride terraces exist. The resultant crystalline film is thus useful for an epitaxial nitride layer, or it will be useful for the purpose of surface passivation and subsequent crystalline or amorphous dielectric film overgrowth.

Interface state densities associated with such an epitaxial layer are low because the dangling bonds are consumed with the epitaxial growth process. Moreover, the smooth interface afforded by the Si (111) surface preparation results in an atomically flat nitride layer as well. Such sharp smooth interfaces result in enhanced electron mobility properties (less interface scattering) as well as a superior dopant diffusion barrier. Any residual dangling bonds can be satiated from a $H_2$ or $D_2$ sintering process.

In accordance with the present invention, the above described problems of the prior art are therefore minimized and there is provided an ultrathin crystalline silicon nitride layer on Si (111) for use, primarily though not exclusively as a gate dielectric for semiconductor devices and as a capacitor dielectric in semiconductor memory devices.

Briefly, by growing crystalline silicon nitride on Si (111), the barrier to boron diffusion is retained and, in addition, the channel is not disrupted as in the case of amorphous silicon nitride over a Si (100) substrate.

Another problem of the prior art that is minimized in accordance with the present invention is based upon the fact that as that the drive current is proportional to the capacitance between the gate electrode and the substrate. Therefore, for a given drive current as the contact area of the dielectric decreases the dielectric thickness must also decrease. The result is that electrons from the gate electrode are then capable of tunneling through the dielectric and add to the channel or drain current, resulting in lack of device control. Since the dielectric constant of silicon dioxide is about 3.9 and the dielectric constant of silicon nitride is about 7, a thicker layer of silicon nitride can be provided with the same capacitance and drive current properties, yet prevent electron tunneling through the dielectric.

To form a semiconductor device in accordance with the present invention, there is initially provided a surface of Si (111) which has been cleaned and is atomically flat as defined hereinabove. The Si(111) surface is placed in a standard reaction chamber and the chamber purged and filled with ammonia ($NH_3$) at an ammonia partial pressure of from about $1 \times 10^{-7}$ to about $1 \times 10^{-5}$ Torr at a temperature of from about 850° C. to about 1000° C. for from about 5 seconds to about 5 minutes to provide a thin layer of crystalline silicon nitride on the Si (111) of from about 0.3 nm to about 3 nm. The remainder of the semiconductor device is then fabricated in standard manner by, for example, depositing a doped layer of polysilicon or a metal layer over the silicon nitride layer. In the case of a boron-doped polysilicon electrode, the boron will be prevented from diffusing through the dielectric due to the use of silicon nitride as the dielectric.

While silicon nitride has been discussed above as being the dielectric material, it should be understood that other materials can be used that have a higher dielectric constant than and are compatible with silicon nitride. When there is a lack of silicon compatibility resulting in $SiO_x$ formation at the interface, such as, for example, with tantalum pentoxide ($Ta_2O_5$), titanium dioxide ($TiO_2$) or a perovskite material, a very thin layer of silicon nitride can be used to separate the dielectric material from the Si (111) substrate and/or the electrode over the dielectric, such thin layer having a thickness of about 2 monolayers.

DESCRIPTION OF THE PREFERRED EMBODIMENT

Figure 1:
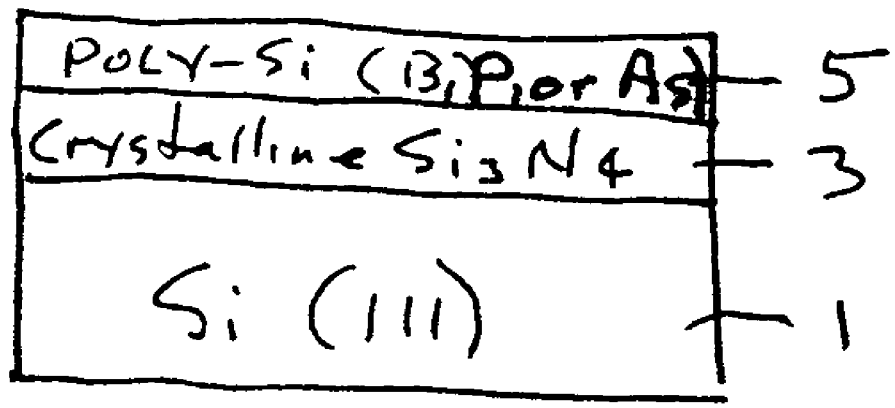
FIG. 1 is a cross sectional view of a semiconductor device fabricated in accordance with a first embodiment in accordance with the present invention.

Referring first to FIG. 1, there is shown a semiconductor device fabricated in accordance with a first embodiment of the present invention. The semiconductor device includes a Si (111) substrate 1 over which is formed a dielectric layer of crystalline silicon nitride ($Si_3N_4$)3. An electrode layer 5 of boron- or phosphorous- or arsenic-doped polycrystalline silicon is formed over the dielectric layer to form the completed semiconductor active transistor structure.

The semiconductor device of FIG. 1 is fabricated by providing a substrate 1 having an exposed surface which is cleaned in a manner as described above and is atomically flat. The substrate was placed in a reaction chamber which was purged and then filled with ammonia gas at a pressure of $1 \times 10^{-6}$ Torr at a temperature of 900° C. for 4 minutes to form the layer of crystalline silicon nitride 3 having a thickness of 0.5 nm on the cleaned surface. The reaction chamber was then purged and polycrystalline silicon with boron or phosphorous or arsenic was deposited over the silicon nitride layer in standard manner to provide the electrode layer 5.

Figure 2:
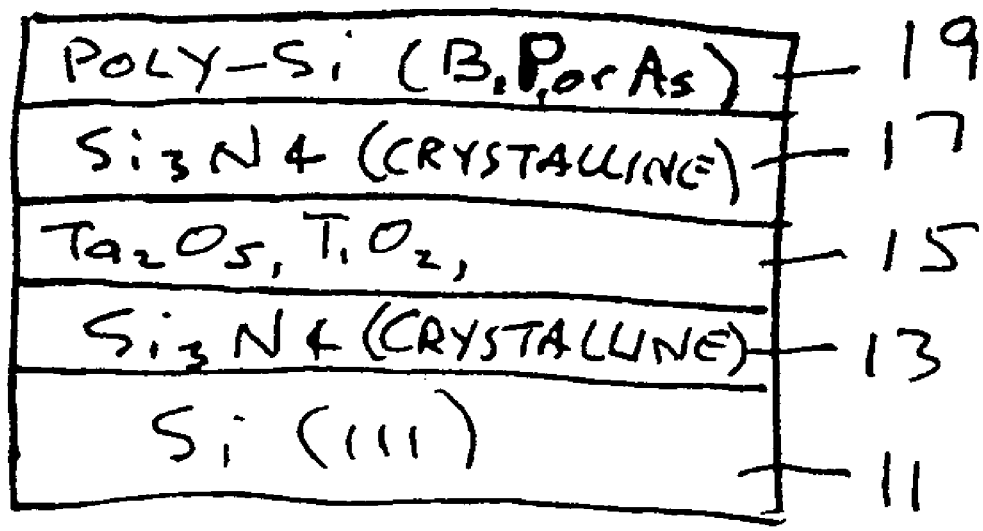
FIG. 2 is a cross sectional view of a semiconductor device fabricated in accordance with a second embodiment in accordance with the present invention.

Referring first to FIG. 2, there is shown a semiconductor device fabricated in accordance with a second embodiment of the present invention. The semiconductor device includes a Si (111) substrate 11 over which is formed a first dielectric layer of crystalline silicon nitride ($Si_3N_4$) 13 having a two monolayer thickness. A second layer of tantalum pentoxide 15 is then deposited over the silicon nitride having a thickness of 4 nm followed by a third dielectric layer of silicon nitride 17 having a two monolayer thickness An electrode layer 19 of boron- or phorphorous- or arsenic-doped polycrystalline silicon is formed over the third dielectric layer 17 to form the completed semiconductor active transistor structure.

The semiconductor device of FIG. 2 is fabricated by providing a substrate 11 having an exposed surface as in the first embodiment. The substrate was placed in a reaction chamber which was purged and then filled with ammonia gas at a pressure of $1 \times 10^{-6}$ Torr at a temperature of 900° C. for 4 minutes to form the first dielectric layer of crystalline silicon nitride 13 having a thickness of two monolayers on the cleaned surface. The reaction chamber was then purged and the second dielectric layer of tantalum pentoxide 15 having a thickness of 4 nm was deposited over the first dielectric layer in standard manner. The reaction chamber was again purged and the third dielectric layer of crystalline silicon nitride 17 was deposited over the second dielectric layer 15 using the same procedure as used for the first dielectric layer. A layer of polycrystalline silicon with boron or phosphorous or arsenic was deposited over the silicon nitride layer in standard manner to provide the electrode layer 5.

Though the invention has been described with reference to specific preferred embodiments thereof, many variations and modification will immediately become apparent to those skilled in the art. It is therefore the intention that the appended claims be interpreted as broadly as possible in view of the prior art to include all such variations and modifications.

What is claimed is:

1. A semiconductor device which comprises:
    (a) a silicon (111) surface;
    (b) a dielectric layer of crystalline silicon nitride on said surface; and
    (c) an electrode layer on said dielectric layer of silicon nitride.

2. The device of claim 1 wherein said surface is cleaned and atomically flat.

3. The device of claim 2 wherein said electrode layer is boron doped silicon.

4. The device of claim 1 wherein said electrode layer is boron doped silicon.

5. A semiconductor device which comprises:
    (a) a silicon (111) surface;
    (b) a first dielectric layer of crystalline silicon nitride on said surface having a thickness of about 2 monolayers;
    (c) a second dielectric layer on said first dielectric layer compatible with silicon nitride and having a higher dielectric constant than silicon nitride; and
    (d) an electrode layer over said second dielectric layer.

6. The device of claim 5 further including, between said second dielectric layer and said electrode layer, a third dielectric layer of silicon nitride having a thickness of about 2 monolayers.

7. The device of claim 6 wherein said second dielectric layer is taken from the class consisting of tantalum pentoxide, titanium dioxide and a perovskite material an electrode layer on said dielectric layer of silicon nitride.

8. The device of claim 7 wherein said electrode layer is boron doped silicon.

* * * * *

EX PARTE REEXAMINATION CERTIFICATE (5058th)
United States Patent
Wallace et al.

(10) Number: US 6,420,729 C1
(45) Certificate Issued: Feb. 8, 2005

(54) PROCESS TO PRODUCE ULTRATHIN CRYSTALLINE SILICON NITRIDE ON SI (111) FOR ADVANCED GATE DIELECTRICS

(75) Inventors: Robert M. Wallace, Richardson, TX (US); Glen D. Wilk, Dallas, TX (US); Yi Wei, Chandler, AZ (US); Sunil V. Hattangady, McKinney, TX (US)

(73) Assignee: Texas Instruments Incorporated, Dallas, TX (US)

Reexamination Request:
No. 90/006,359, Aug. 16, 2002

Reexamination Certificate for:
Patent No.: 6,420,729
Issued: Jul. 16, 2002
Appl. No.: 09/747,966
Filed: Dec. 27, 2000

Related U.S. Application Data

(62) Division of application No. 09/270,173, filed on Mar. 16, 1999, now Pat. No. 6,277,681.

(51) Int. Cl.[7] ............................................... H01L 29/04
(52) U.S. Cl. .......................................... 257/64; 438/198
(58) Field of Search ................................ 438/198, 287; 257/64, 646, 410–411

(56) References Cited

U.S. PATENT DOCUMENTS

| | | |
|---|---|---|
| 3,574,677 A | 4/1971 | Pammer et al. |
| 4,435,447 A * | 3/1984 | Ito et al. ...................... 438/775 |
| 5,691,220 A * | 11/1997 | Ohnishi et al. ............. 438/253 |
| 5,966,624 A * | 10/1999 | Shen .......................... 438/478 |
| 6,278,164 B1 * | 8/2001 | Hieda et al. ................. 257/410 |

\* cited by examiner

*Primary Examiner*—Jey Tsai

(57) ABSTRACT

A method of making a semiconductor device and the device. The device, according to a first embodiment, is fabricated by providing a silicon (111) surface, forming on the surface a dielectric layer of crystalline silicon nitride and forming an electrode layer on the dielectric layer of silicon nitride. The silicon (111) surface is cleaned and made atomically flat. The dielectric layer if formed of crystalline silicon nitride by placing the surface in an ammonia ambient at a pressure of from about $1 \times 10^{-7}$ to about $1 \times 10^{-5}$ Torr at a temperature of from about 850° C. to about 1000° C. The electrode layer is heavily doped silicon. According to a second embodiment, there is provided a silicon (111) surface on which is formed a first dielectric layer of crystalline silicon nitride having a thickness of about 2 monolayers. A second dielectric layer compatible with silicon nitride and having a higher dielectric constant than silicon nitride is formed on the first dielectric layer and an electrode layer is formed over the second dielectric layer. A third dielectric layer of silicon nitride having a thickness of about 2 monolayers can be formed between the second dielectric layer and the electrode layer. The second dielectric layer is preferably taken from the class consisting of tantalum pentoxide, titanium dioxide and a perovskite material. Both silicon nitride layers can be formed as in the first embodiment. The electrode layer is preferably heavily doped silicon

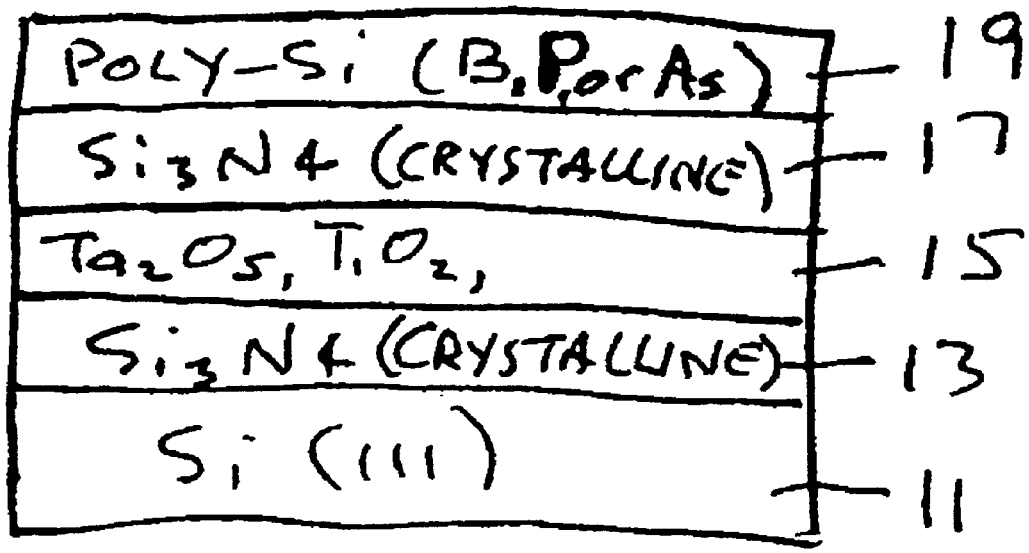

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 5–8 is confirmed.

Claims 1 and 4 are cancelled.

Claim 2 is determined to be patentable as amended.

Claim 3, dependent on an amended claim, is determined to be patentable.

[1. A semiconductor device which comprises:
  (a) a silicon (111) surface;
  (b) a dielectric layer of crystalline silicon nitride on said surface; and
  (c) an electrode layer on said dielectric layer of silicon nitride.]

2. [The device of claim 1] *A semiconductor device which comprises:*
  (*a*) *silicon (111) surface:*
  (*a*) *a dielectric layer of crystalline silicon nitride on said surface; and*
  (*b*) *an electrode layer on said dielectric layer of silicon nitride:*
wherein *said surface is cleaned and atomically flat.*

* * * * *